United States Patent [19]

Koike et al.

[11] Patent Number: 4,658,138

[45] Date of Patent: Apr. 14, 1987

[54] SCANNING ELECTRON MICROSCOPE

[75] Inventors: Kazuyuki Koike, Nishitama; Kazunobu Hayakawa, Chofu, both of Japan

[73] Assignee: Hitachi, Ltd., Tokyo, Japan

[21] Appl. No.: 702,223

[22] Filed: Feb. 15, 1985

[30] Foreign Application Priority Data

Feb. 24, 1984 [JP] Japan .................................. 59-32316

[51] Int. Cl.⁴ ............................................ G01N 23/00
[52] U.S. Cl. ..................................... 250/310; 250/306
[58] Field of Search ...................... 290/310, 492.1, 306, 290/307, 397

[56] References Cited

U.S. PATENT DOCUMENTS 3,329,813  7/1967  Hashimoto .......................... 250/310
4,153,844  5/1979  Kirschmer ........................ 250/492.1
4,455,486  6/1984  Rau ...................................... 250/307

Primary Examiner—Bruce C. Anderson
Attorney, Agent, or Firm—Antonelli, Terry & Wands

[57] ABSTRACT

The present invention relates to a scanning electron mircoscope suitable for observing the magnetization condition of the portion of a magnetic material which is in the vicinity of the surface thereof. This microscope consists of means for emitting a fine electron beam to the upper surface of a sample, means for scanning the sample surface with the fine electron beam, means for collecting secondary electrons from the sample, means for detecting a spin polarization vector of the collected secondary electrons, means for converting a component, which is in an arbitrary direction in the surface of the sample, and/or a component, which is in the normal direction of the surface of the sample, of the detected polarization vector into a picture signal which is representative of an image obtained through the scanning electron microscope, and means for indicating the picture image on a display.

7 Claims, 3 Drawing Figures

SCANNING ELECTRON MICROSCOPE

BACKGROUND OF THE INVENTION

This invention relates to a scanning electron microscope, and more particularly to a scanning electron microscope suitable for observing the magnetization condition of the portion of a magnetic material which is in the vicinity of its outer surface.

There are two types of magnetization distribution observing methods using a scanning electron microscope, one of which utilizes the deflection of secondary electrons in a magnetic field in the vicinity of the outer surface of a magnetic material (D. C. Joy et al, Phil. Mag. 17 (1968) 61), and the other of which utilizes the deflection of reflected electrons in a magnetic field in a sample material (J. Philibert et al, Micron 1 (1969) 174). In both of these methods, the relative differences betwen the magnetization directions in magnetic domains can be observed but it is difficult to determine the magnetization directions and the magnitude of the magnetization, the resolution of these methods being 1 μm at the highest. These inconveniences occur for the following reasons.

In the former method which utilizes a stray magnetic field generated due to the magnetization of a sample, a magnetic domain structure having no stray magnetic fields cannot be observed in an extreme case. Even if a stray magnetic field exists in a magnetic domain structure, the magnetic fields, which are away from the outer surface of the sample, generated due to different magnetic domains offset each other when the magnetization distribution is dense, so that the magnetic field decreases. Consequently, it becomes difficult to deflect secondary electrons by utilizing a stray magnetic field, and magnetization distribution cannot be observed. It is not so easy to determine magnetization direction by utilizing a stray magnetic field; it is next to impossible to determine magnetization direction by utilizing secondary electrons which are deflected by a stray magnetic field.

In the latter method, the deflection of the reflected electrons due to a magnetic field in the interior of a sample is utilized to turn the intensity of the reflected electrons detected in a specific direction into video signals and thereby observe the magnetic domains. However, in order to form a clear image of a magnetic domain structure, it is necessary to increase the energy of the primary electrons. When such energy is increased, the reflected electrons in the interior of a sample expand greatly, so that resolution does not increase; the limit of the resolution in this method is 1 μm.

The resolution of a regular scanning electron microscope for observing a microscopic structure with secondary electrons is determined by the probe diameter of a primary electron beam. However, when the magnetization distribution is observed by the above-described methods, the lower limit of resolution is determined by the intensity of a stray magnetic field, the intensity of a magnetic field in the interior of a sample and the degree of expansion of the reflected electrons. Accordingly, even when the diameter of the probe is reduced, resolution cannot be increased.

SUMMARY OF THE INVENTION

The present invention has been developed with a view to eliminating these faults. It is an object of the invention to provide a scanning electron microscope capable of observing with a high resolution the two-dimensional distribution of magnetization vectors on the surface of a sample magnetic material.

To achieve this object, the present invention provides a scanning electron microscope comprising means for emitting a fine electron beam against the upper surface of a sample, means for scanning the surface of said sample with said fine electron beam, means for collecting the secondary electrons emitted from said sample while said sample is irradiated with said electron beam, means for detecting a component of a spin polarization vector of said collected secondary electrons, means for converting said detected component of said spin polarization vector into a picture signal, and means for displaying said picture signal.

DESCRIPTION OF THE PREFERRED EMBODIMENTS:

First, the basic principle of the present invention will be described.

Figure 1:
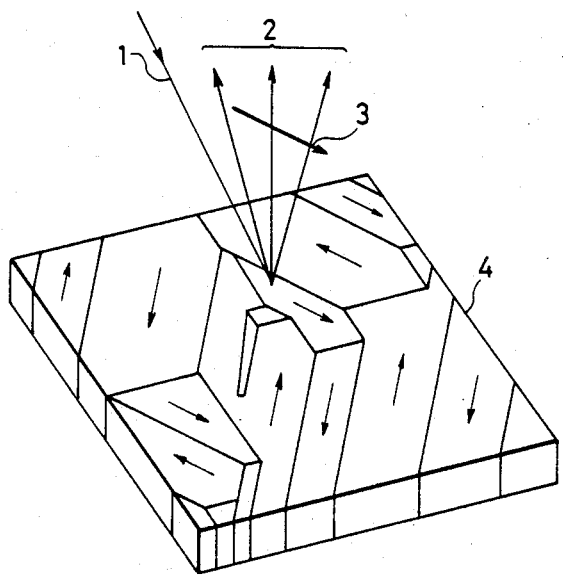
FIG. 1 illustrates the basic principle of the present invention.

Referring to FIG. 1, a spin polarization vector 3 of the secondary electrons 2 occurring when a primary electron beam 1 is applied to a magnetic material 4 is antiparallel to a magnetization vector in the place from which the secondary electrons originate. When the surface of the sample is scanned with the primary electron beam, a component of the spin polarization vector of the secondary electrons is detected with an electron detector and the component is indicated in the form of a video signal on a display, the two-dimensional distribution of the magnetic vector on the surface of the magnetic material can be observed.

Generally, an electron has the degree of internal freedom spin, the value of which is $+\frac{1}{2}$ or $-\frac{1}{2}$ with respect to any direction. If the spin with respect to the i-direction of the electrons constituting an electron beam is measured to determine that there are Ni electrons having a value of $+\frac{1}{2}$, and Ni-electrons having a value of $-\frac{1}{2}$, the spin polarization Pi with respect to the i-direction in this electron beam can be express as:

$$P_i = \frac{N_i + - N_i -}{N_i + - N_i -} \quad (1)$$

Let Px, Py and Pz equal the spin polarization Pi measured with respect to the direction of the axes of a rectangular coordinate system consisting of x, y and z axes. The spin polarization vector p can be expressed as:

$$\mathbb{P} = (P_x, P_y, P_z) \quad (2)$$

An electron beam of $\mathbb{P} \neq 0$ is called a polarized electron beam.

Figure 2:
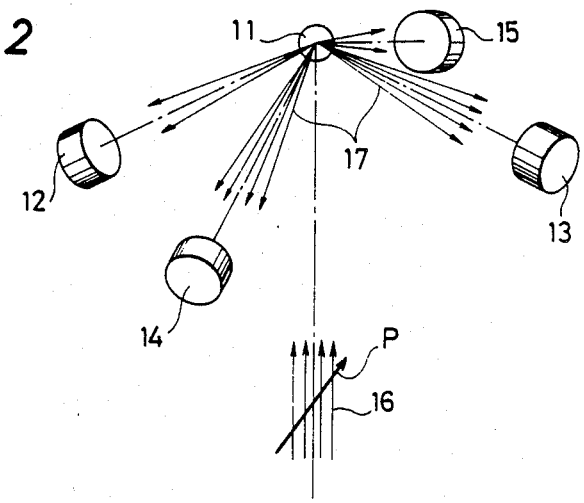
FIG. 2 illustrates an example of the spin polarization measuring method using a Mott detector.
Figure 2:
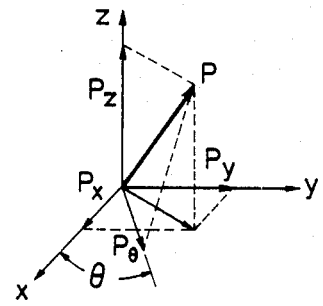

There are several methods for measuring such spin polarization. A spin polarization measuring method using a Mott detector will be taken as an example of such methods in the following description based on FIG. 2. When a high-energy polarized electron beam 16 is scattered by a heavy atom of gold 11 (reference numeral 17 in the drawing denotes scattered electrons), an intensity asymmetry of scattered electrons occurs around the axis of incidence as a result of spin dependent interaction. Let Nsx+ and Nsx− equal the number of scattered electrons detected by two electron detectors 12, 13 which are placed in symmetrical positions with respect to an x-z plane. An x-component Px of a polarization vector P can then be expressed as:

$$Px = \frac{1}{S} \frac{Nsx+ - Nsx-}{Nsx+ + Nsx-} \quad (3)$$

where S is a constant which is determined by the kind of target atom, energy of an incident electron and scattered angle of the electrons. Similarly, if two electron detectors 14, 15 are placed in symmetrical positions with respect to a y-z plane, Py can be determined. If, for example, an x-y plane includes the surface of a sample, a component $P\theta$ in he direction at an angle $\theta$ to the x-axis in the x-y plane, can be expressed by using Px and Py referred to above, as:

$$P\theta = Px \cos \theta + Py \sin \theta \quad (4)$$

Pz can be determined in the same way by rotating the spin polarization vector P 90° around the x-axis or y-axis with a spin rotator such as a Wien filter.

When spin polarization Px, Py, Pz has thus been determined, the two-dimensional distribution of the magnetic vector on the surface of a sample magnetic material and a component in an arbitrary direction in the surface of the sample can be determined.

The resolution is determined in this method in the same manner as in a similar method using a typical scanning electron microscope for observing microscopic structure, i.e., by the probe diameter of the primary electron beam. The resolution in the method described above can be expected to improve considerably more than that of the conventional method of this kind.

Figure 3:
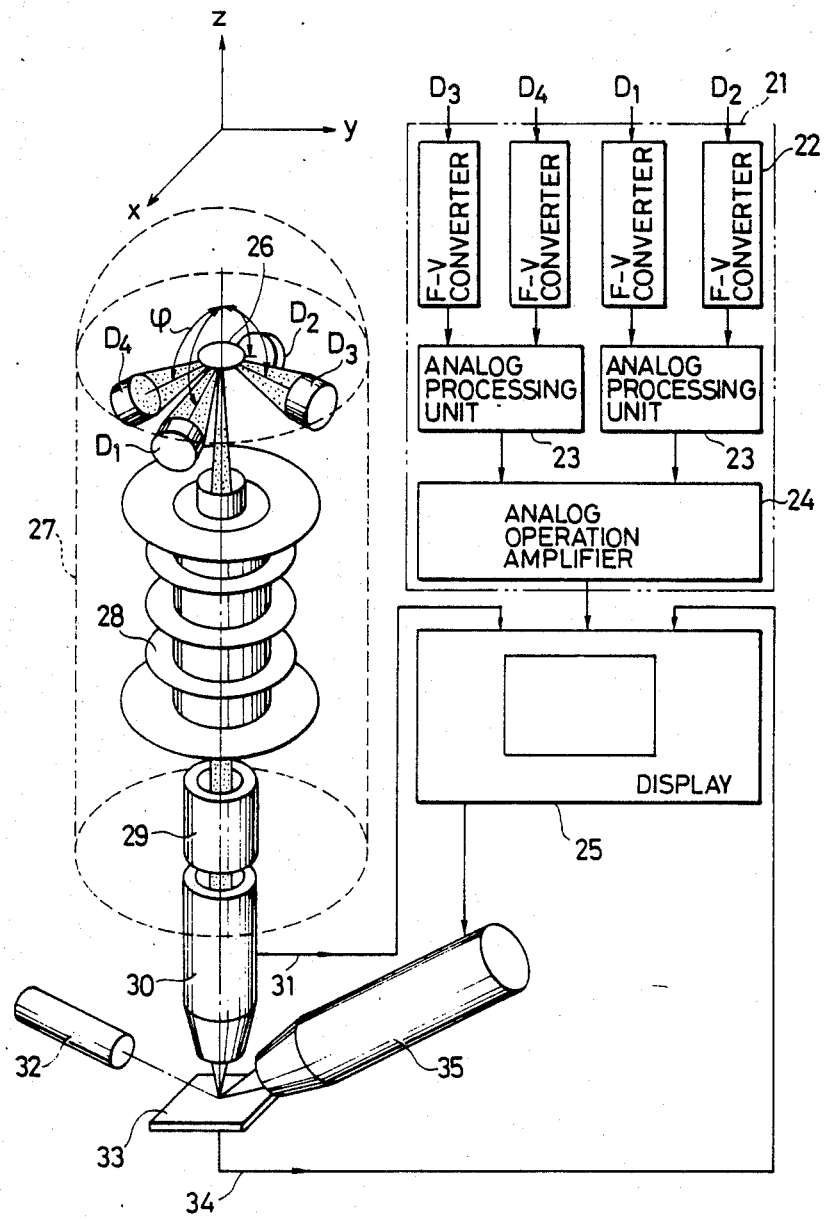
FIG. 3 illustrates an embodiment of a scanning electron microscope according to the present invention.

An embodiment of the present invention will now be described with reference to FIG. 3. After the surface of, for example, iron (001), which constitutes a sample 33, is cleaned with an ion gun 32, an electron beam from a field emission electron gun 35 is accelerated to 10 kV and focussed to 500 Å on the surface of the sample to scan the same surface therewith. The secondary electrons from the sample 33 are collected by an extraction electrode 30, and introduced into, for example, a Mott detector 27. The electron beam which is accelerated to 100 KeV by an accelerating tube 28 in the detector 27 is scattered by a thin gold film 26 of 500 Å in thickness. Of the scattered electrons, those electrons having a scattering angle $\phi$ of, for example, 120° and which are scattered in the +y, −y, +x and −x directions are detected by detectors $D_1$, $D_2$, $D_3$, $D_4$, respectively. The output pulses from the detectors $D_3$, $D_4$ out of these four detectors are converted into analog signals by, for example, a frequency-voltage converter 22. These analog signals are sent to an analog processing unit 23, from which an analog signal corresponding to the x-direction component Px of the spin polarization spector is obtained in accordance with the formula (3). An analog signal corresponding to Py is obtained in a similar manner from the outputs from the detectors $D_1$, $D_2$. From these two signals, a component in the direction which is on the surface of the sample and which is 45° from the x-axis is obtained with an analog operation amplifier 24 in accordance with the formula (4). When this signal is indicated as a video signal on a display 25, the two-dimensional distribution of a component of the magnetization vector in the direction which is in the surface of the sample and which is 45° from the x-axis is observed. When a polarization vector is rotated 90° around the y-axis by a Wien filter 29, a component in the x-direction obtained after rotating the vector is equal to the component Pz in the z-direction which is obtained before the vector has been rotated.

A signal corresponding to Pz can be obtained by the same method as is used to obtain a signal corresponding to Px. When the signal corresponding to Pz is indicated as a video signal on the display, the two-dimensional distribution of a component of the magnetic vector in the normal direction on the surface of the sample can be observed.

This method enables the magnetization distribution on the surface of iron (001) to be observed with a resolution of 500 Å which is far higher than that in the conventional method of this kind.

When an absorption current in the sample is used as a picture signal, the geometrical structure on the sample surface can be observed in exactly the same area as in the observation of the magnetization distribution mentioned above.

When a secondary electron current 31 obtained at a secondary electron-extraction electrode is used as a video signal, the geometrical structure of the surface of a sample can be observed in exactly the same area as in the observation of the magnetization distribution mentined above, and with a higher S/N ratio than in the case where an absorption current in a sample is used as a picture signal.

This scanning electron microscope can also be so constructed that three components of the spin polarization vector of the secondary electrons from one arbitrarily designated point on a magnetization distribution image or a secondary electron current image or an absorption current image are detected and displayed.

The three components of the spin polarization of secondary electrons were measured as a primary electron beam was applied in a fixed manner to one point in a bright portion of a magnetization distribution image. The results were Px=16%, Py=16% and Pz=0%.

The component $P\theta$ in an arbitrarily direction in the surface of a sample of the spin polarization vector P can also be determined directly without determining the Px and Py components. If the angle $\theta$ with respect to the x-axis is varied, for example, if a pair of electron detectors of a spin polarization vector P are rotated around the axis of a polarized electron beam, the two-dimensional distribution of the $P\theta$ component can be determined. Thus, the direction of a component in the surface of a sample of a magnetic vector in the same surface is determined.

If the $\theta$ of $P\theta$ is taken in the direction of an easy axis of the magnetization, a very clear magnetic domain image can be obtained.

The above-mentioned component Pz in the normal direction to the surface of a sample of the spin polarization vector P is effectively utilized for the observation of a magnetic domain, which has a perpendicular magnetic vector with respect to the surface of the sample, in the recording of vertical magnetism.

When a signal processor consisting of a pulse counter, a digital arithmetic circuit and a D-A converter was used instead of the analog signal processing system 21 which was used in the above-described operation for obtaining a magnetization distribution image, a magnetization distribution image, which is not influenced at all by the fluctuation of the secondary electron current of not less than 40 dB, could be observed.

When the electron gun 35 was replaced by a thermal field emission gun, a large current could be obtained uniformly for a long time, and a resolution of 200 Å could be attained. When the electron gun 35 was replaced by a thermionic emission gun, the electron microscope could be operated even in a vacuum of lower than $10^{-6}$ Torr.

As described above, the scanning electron microscope according to the present invention enables the two-dimensional distribution of a magnetic vector in the surface of a magnetic material to be observed with a high resolution, and has an extremely high industrial value.

What is claimed is:

1. A scanning electron microscope comprising means for emitting a fine electron beam to the upper surface of a magnetized sample, means for scanning the surface of said sample with said fine electron beam to enable discharge of secondary electrons from said sample, means for collecting secondary electrons from said sample, means for detecting a spin polarization vector of said collected secondary electrons according to a magnetization in the portion of said sample from which said secondary electrons are discharged, means for converting a component which is in an arbitrary direction in the surface of said sample, and/or a component which is in the normal direction of the surface of said sample, of said detected polarization vector into a video signal which is representative of an image obtained through said scanning electron microscope, and means for indicating said video image on a display so as to enable observation of a two-dimensional distribution of the magnetization vector on the surface of said magnetized sample.

2. A scanning electron microscope according to claim 1, wherein said microscope further includes means for cleaning the surface of said sample.

3. A scanning electron microscope according to claim 1, wherein said microscope includes means for indicating a secondary electron current from said sample or an absorption current therein as a video signal on said display.

4. A scanning electron microscope according to claim 1, wherein said electron beam-emitting means consists of a field emission gun.

5. A scanning electron microscope according to claim 1, wherein said spin polarization vector-detecting means is provided with a spin rotator capable of rotating said spin polarization vector at 90° around an axis which is parallel to the surface of said sample, and a plurality of electron detectors placed in symmetrical positions around an incident axis of a beam of said collected secondary electrons.

6. A scanning electron microscope according to claim 1, wherein said means for converting an output signal from said spin polarization detector into a video signal consists of a circuit including an analog adder, an analog subtractor, an analog divider and an analog trigonometric function-computing element.

7. A scanning electron microscope according to claim 2, wherein said means for cleaning the surface of said sample consists of an ion gun.

* * * * *